United States Patent [19]

Pacou et al.

[11] Patent Number: 5,336,627
[45] Date of Patent: Aug. 9, 1994

[54] METHOD FOR THE MANUFACTURE OF A TRANSISTOR HAVING DIFFERENTIATED ACCESS REGIONS

[75] Inventors: Thierry Pacou, Les Ulis; Patrice Arsene-Henry, Massy; Tung N. Pham, Paris; Yann Genuist, Massy, all of France

[73] Assignees: Thomson-CSF Semiconducteurs Specifiques, Puteaux, France; Thomson-CSF Semiconducteurs Specifiques, Puteaux, France

[21] Appl. No.: 4,088

[22] Filed: Jan. 13, 1993

[30] Foreign Application Priority Data

Jan. 24, 1992 [FR] France .................. 92 00748

[51] Int. Cl.⁵ ........................... H01L 21/266
[52] U.S. Cl. ........................... 437/41; 437/147; 437/184; 437/912
[58] Field of Search ........... 437/41, 96, 104, 133, 437/147, 184, 912; 156/661.1; 148/DIG. 56, DIG. 65

[56] References Cited

U.S. PATENT DOCUMENTS

| | | | |
|---|---|---|---|
| 4,283,483 | 8/1981 | Coane | 437/229 |
| 4,992,387 | 2/1991 | Tamura | 437/912 |
| 4,997,779 | 3/1991 | Kohno | 437/41 |
| 5,001,077 | 3/1991 | Sakai | 437/912 |
| 5,112,766 | 5/1992 | Fujii et al. | 437/912 |
| 5,187,111 | 2/1993 | Nogami et al. | 437/184 |

FOREIGN PATENT DOCUMENTS 2639762  1/1990  France .
2661278 10/1991  France .

OTHER PUBLICATIONS

Japanese Journal of Applied Physics/Part 2: Letters 27, Jul. 1988, No. 7, T. Kimura, et al., pp. 1340-1343, "Asymmetric Implantation Self-Alignment Technique ...".

Patent Abstracts Of Japan, vol. 8, No. 103 (E-244)(1540) & JP-A-59 018 679 Jan. 31, 1984, K. Kotani, "Semiconductor Device."

Primary Examiner—Tom Thomas
Assistant Examiner—Chandra Chaudhori
Attorney, Agent, or Firm—Oblon, Spivak, McClelland, Maier & Neustadt

[57] ABSTRACT

The disclosure relates to the making of the source and drain access regions of a field-effect transistor, these two regions being differentiated. The control region is defined by means of a three-layer mask of metal, resin and metal. A resin mask protects the drain access region, thus enabling the implantation of the source access region. After the dissolving of the resins, the drain access region is implanted.

4 Claims, 1 Drawing Sheet

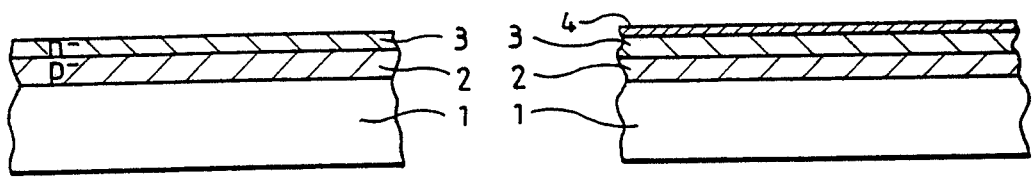
FIG.1 FIG.2
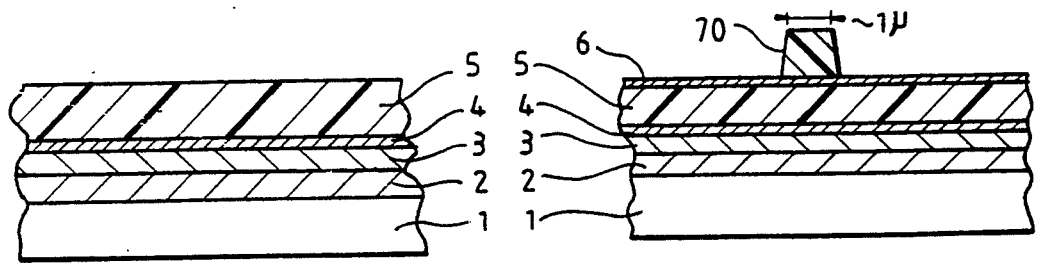
FIG.3 FIG.4
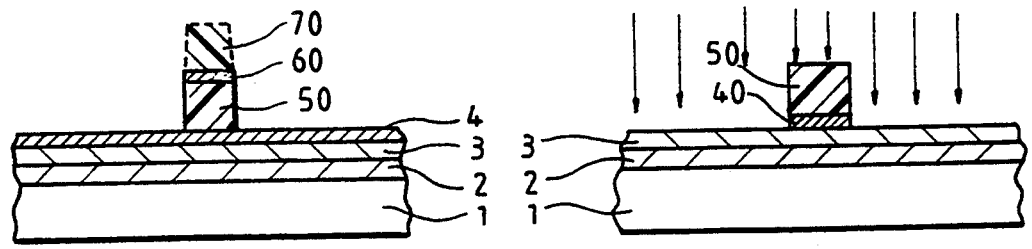
FIG.5 FIG.6
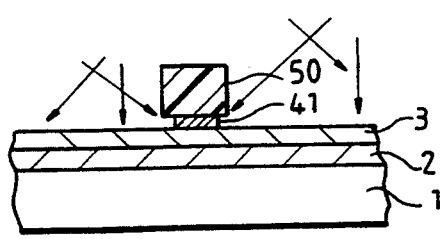 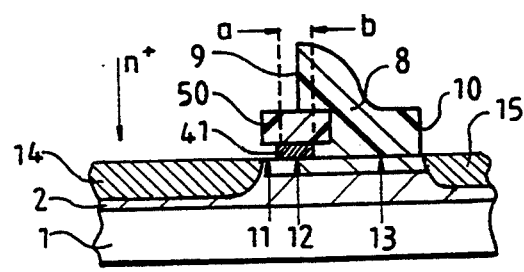
FIG.7 FIG.8
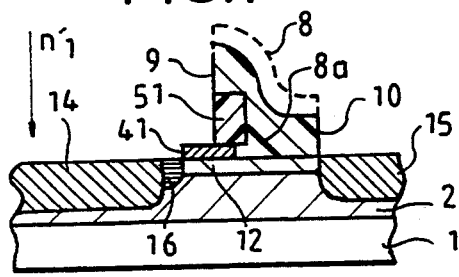 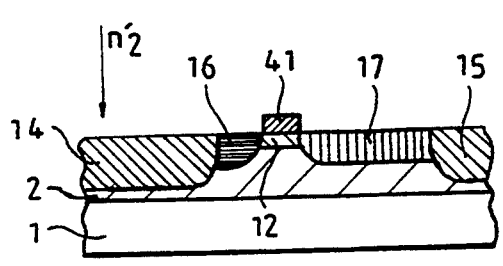
FIG.9 FIG.10

METHOD FOR THE MANUFACTURE OF A TRANSISTOR HAVING DIFFERENTIATED ACCESS REGIONS

BACKGROUND OF THE INVENTION

1. Field of the Invention

The present invention relates to a method for the manufacture, by a self-alignment technique, of a transistor having differentiated access regions. More specifically, this manufacturing method, which makes use of three masking layers, enables the self-alignment of the control electrode metallization on both access regions which have different characteristics in terms of dimensions and doping level.

This method can be applied to all transistors, of the bipolar or unipolar type, but it is especially adapted to field-effect transistors and, above all, to transistors that are made on III–V materials such as GaAs and work in microwave applications.

2. Description of the Prior Art

For, in this field, the very small submicronic dimensions of the gate length most often make it necessary to resort to special techniques that make up for the inadequate precision of the masking means.

Self-alignment techniques are presently much used owing to their influence on manufacturing cost and on the improvement of performance characteristics. However, in the case of microwave transistors on III-V materials, for which it is necessary to control the gate, source and drain resistance values, respectively $R_G$, $R_S$ and $R_D$, there is no practical and economical technology that can be used to differentiate the doping levels on the source side and drain side, beneath the gate and in the access zones.

For example, the technique known as the "side wall" technique, which uses a mask deposited on a side wall of a pattern, permits n' implantations but is incompatible with n" implantations of $L_{DD}$ for the fine gates (n' and n" correspond to two intermediate doping levels between light doping n and heavy doping n+, and $L_{DD}$ is an abbreviation commonly used to designate a lightly doped drain region).

Or again, there is the technique of the metallic mask made of nickel that rules out a new masking after an over-etching of the gate and is incompatible with an etching of the mask on the source side.

Finally, the technique of the dielectric mask made of $SiO_2$ is limited by the selectivity of etching and is not compatible with differentiated n' and n" dopings.

SUMMARY OF THE INVENTION

The method according to the invention enables the making of regions having differentiated dopings in a microwave transistor, by the implementation of simple means of lithography, deposition, etching, implantations etc. For example, an optical masker having a definition of one micrometer can be used, according to the method of the invention, to obtain patterns defined to a precision of 0.2 micrometer, solely by plasma etching. This is obtained by means of three-layer masking, including two metal layers. A resin mask, annealed at high temperature, enables the etching of the gate and then the over-etching of this gate up to 0.2 μm, and the differentiated n' and n" implantation of the source side and drain side regions (which makes it possible to adjust the access resistors $R_S$ and $R_d$ separately) and finally the n+ implantation of the source and drain zones. The region beneath the gate is implanted before the maskings.

More specifically, the invention lies in a method for the manufacture of a transistor, its access regions, on each side of the control region, being differentiated, this method implementing the techniques of self-alignment and using a three-layer mask constituted by a layer of resin, annealed at high temperature, between two metal layers.

BRIEF DESCRIPTION OF THE DRAWINGS

The invention will be understood more clearly from the following description of an exemplary embodiment, made with reference to the appended drawings, FIGS. 1–10, which represent various steps of the method.

MORE DETAILED DESCRIPTION

The starting product is of course a wafer of semiconductor material that has previously undergone a certain number of operations aimed at the batch manufacture of a given type of semiconductor device, such as a transistor or integrated circuit comprising at least one transistor. These operations may include varied types of epitaxies, maskings and etchings: they are beyond the scope of the invention and their traces are not shown in the figure.

However, these prior operations should not include dopings which modify the surface regions. As is shown in FIG. 1, this then enables the implantation, in a substrate 1 made of semi-insulator GaAs for example, of a p− type doped layer 2 and a n− type doped layer 3: the n− layer subsequently constitutes the channel of the transistor.

On the unoccupied face of the layer 3, there is deposited (FIG. 2) a refractory layer 4 with a thickness of about 4000 Å, made of tungsten nitride/tungsten WN/W, which constitutes the first metal mask, then a layer 5 of masking resin (FIG. 3). Deposited at a thickness of about 1.2 micrometer, this resin is of a cross-linkable type: it is annealed at high temperature to make it cross-linked, for 5 minutes at 260° C.

On this resin layer 5, there is deposited an intermediate layer 6 of tungsten (FIG. 4), with a thickness of about 200 to 300 Å: it is the second metal mask. A second layer of cross-linkable resin is deposited on the tungsten 6: this second layer is not shown in FIG. 5 except by what remains of it after optical masking and lithography, giving a pattern 70. This micrometer-sized pattern is the mask of the future gate of the transistor.

The mask 70 then makes it possible (FIG. 5) to form a new mask which withstands the etching and under-etching of tungsten and the implantations. Reactive ion etching (RIE) in the presence of sulphur hexafluoride is used to etch the layer 6 of tungsten, of which all that remains is a fragment 60 protected by the pattern 70. Then, reactive ion etching in the presence of $O_2+Ar$ is used to etch the resin mask 70 and the resin layer 5, of which all that remains is a fragment 50.

The gate metallization is etched in the layer 4 of WN/W (FIG. 6) by a third etching, which is anisotropic, by low pressure RIE in the presence of $NF_3$ or $SF_6$: the fragment 60 with a thickness of 200 Å disappears and, of the layer 4, with a thickness of 4000 Å, all that remains is a fragment 40 which, despite successive modifications since FIG. 4, still has a definition of the order of one micrometer.

This definition is improved by a fourth etching (FIG. 7), which is an isotropic etching, by high-pressure RIE in the presence of $SF_6+C_2F_6$. This etching attacks the metal of the fragment 41 of the WN/W layer. This operation is called "over-etching" if it is considered from the viewpoint of the fact that the metal undergoes more etching, or it is called "under-etching" if it is considered from the viewpoint of the fact that the metal is etched beneath the mask. For a pattern 40 with a size of one micrometer, the pattern 41 may have a width of 0.–0.6 micrometer.

A new layer of thick resin is deposited on the wafer and then etched to define a mask 8 as shown in FIG. 8. This mask partially covers the mask 50, and the flank 9 of the mask 8 is located between the two limits "a" and "b" which correspond to the edges of the metal pattern 41. The flank 10 of the mask 8 is located vertically above the edge of the future drain zone. Thus the mask 50, in cooperation with the mask 8, receives the entire central part of the transistor: access region 11 on the source side, region 12 beneath the gate, access region 13 on the drain side.

An $n^+$ type ion implantation then makes it possible to make the source zone 14 and drain zone 15, in the thickness of the semiconductor layers 2 and 3. At this point of the method, the three regions 11, 12 and 13 between the two zones 14 and 15 are not differentiated: all three of them have the doping level of the starting layer 3.

The next step (FIG. 9) makes it possible first of all to differentiate the source access region, by eliminating the part of the mask 50 which protects the region 11 between the gate 41 and the source zone 14. Reactive ion etching in the presence of oxygen is used to etch this part of the mask 50 up to the metal layer 41. However, this etching also erodes the mask 8, which becomes thinner and forms a mask 8a. Hence, for the mask 8a to be effective, the mask 8 should originally have a thickness substantially twice that of the mask 51.

An ion implantation of the $n'(n<n'<n^+)$ type with an $n'_1$ dose creates the source access region 16.

Finally (FIG. 10), the drain access region is differentiated. To this end, the resin masks 51 and 8a are dissolved or removed by a known means and an n' type ion implantation with an $n'_2$ dose creates the drain access region 17.

The dose $n'_2$ is smaller than the dose $n'_1$ but must be taken into account for the adjusting of the access resistance $R_S$ for the source region 16 receives both doses $n'_1+n'_2$.

The balance of implantations can be written as follows:

gate region 12: $n^-$
source region 16: $n^-+n'_1+n'_2$
drain region 17: $n'_2$
contact zones 14+15: $n^-+n^++n'_1+n'_2$ After planarization by a resin, the gate metallization 41 may be recharged by electrolysis to reduce its electrical resistance.

The method can preferably be applied to power transistors, for it enables an increase in the drain/source voltage $V_{DS}$.

What is claimed is:

1. A method for the manufacture of a transistor, wherein access regions of said transistor, on each of a control region are differentiated, said method implementing techniques of self-alignment and using a four-layer mask comprising a first metal layer formed above a substrate, a first resin layer which is annealed and formed on said first metal layer, a second metal layer formed on said first resin layer, and a second resin layer formed on said second metal layer.

2. A method according to claim 1, comprising the following steps:
   a) on said substrate of semiconductor material, the implantation of a $p^-$ type doped layer and then of an $n^-$ type doped layer;
   b) successive deposits of said first metal layer, said first resin layer, said second metal layer, and said second resin layer, in which there is defined a mask corresponding to the control electrode of the transistor,
   c) first etching of said second metal layer, second etching of said first resin layer, third etching of said first metal layer,
   d) over-etching of the metal pattern remaining beneath said first resin layer after said etching thereof,
   e) deposition of a third resin layer and etching, in said third resin layer, of a mask having a first edge vertically above and aligned with said over-etched metal pattern and having a second edge vertically above a future second contact zone of the access electrode,
   f) $n^+$ type ion implantation of the two access electrode contact zones,
   g) partial etching of the pattern of the first resin layer not protected by the mask of the third resin layer and n' type ion implantation of the first access region located between the over-etched pattern and a first access zone, said $n^+$ type ion implantation being greater in impurity concentration than said $n^-$ type ion implantation, and
   h) dissolving of the remaining resin masks and n' type ion implantation of the second access region located between the over-etched pattern and a second access zone.

3. A method according to claim 2, wherein the transistor is a field-effect transistor, of which:
   the first access region is the source;
   the second access region is the drain;
   the control region is the channel located beneath the over-etched pattern constituting the gate.

4. A method according to claim 2, wherein the first resin layer undergoes a cross-linkage annealing operation at high temperature of 260° C. and wherein the third layer of resin has a thickness greater than that of the first resin layer.

* * * * *